United States Patent [19]

Hemmi

[11] Patent Number: 4,992,937
[45] Date of Patent: Feb. 12, 1991

[54] MICROCOMPUTER HAVING A PROGRAM MODE SETTING CIRCUIT

[75] Inventor: Toru Hemmi, Tokyo, Japan

[73] Assignee: NEC Corporation, Tokyo, Japan

[21] Appl. No.: 501,332

[22] Filed: Mar. 22, 1990

Related U.S. Application Data

[63] Continuation of Ser. No. 820,341, Jan. 21, 1986, abandoned.

[30] Foreign Application Priority Data

Jan. 18, 1985 [JP] Japan .................................. 60-6802

[51] Int. Cl.⁵ ...................... G06F 11/30; G06F 15/46
[52] U.S. Cl. ...................................................... 364/200
[58] Field of Search ................................. 364/200, 900

[56] References Cited

U.S. PATENT DOCUMENTS

| | | | |
|---|---|---|---|
| 3,940,764 | 2/1976 | Beeswing | 307/234 |
| 3,944,982 | 3/1976 | Mogi et al. | 328/111 |
| 3,949,199 | 4/1976 | Odom | 307/234 |
| 3,997,798 | 12/1976 | Breimesser | 307/234 |
| 4,241,416 | 12/1980 | Tarczy-Homoch | 364/900 |
| 4,337,513 | 6/1982 | Furubashi | 364/200 |
| 4,363,092 | 12/1982 | Abo et al. | 364/200 |
| 4,463,416 | 7/1984 | Wood | 364/900 |
| 4,479,191 | 10/1984 | Nojima et al. | 364/900 |
| 4,531,198 | 7/1985 | Matsuda | 364/900 |
| 4,675,597 | 6/1987 | Hernández | 307/234 |
| 4,677,308 | 6/1987 | Wroblewski et al. | 340/52 F |
| 4,780,819 | 10/1988 | Kashiwagi | 364/200 |
| 4,799,176 | 1/1989 | Cacciatore | 364/557 |

Primary Examiner—Andrew J. James
Assistant Examiner—Viet Q. Nguyen
Attorney, Agent, or Firm—Sughrue, Mion, Zinn, Macpeak & Seas

[57] ABSTRACT

A microcomputer comprises at least one external terminal through which a plurality of pulse signals, each of which as different pulse widths, are received, a pulse width measuring circuit measuring a pulse width of a received pulse signal, and an address generating circuit generating a plurality of addresses, a selecting circuit selecting one of the plurality of addresses. The microcomputer executes a program designated by the selected address.

15 Claims, 4 Drawing Sheets

4,992,937

MICROCOMPUTER HAVING A PROGRAM MODE SETTING CIRCUIT

This is a continuation of application Ser. No. 06/820,341 filed Jan. 21, 1986 now abandoned.

BACKGROUND OF THE INVENTION

1. Field of the Invention

This invention relates to a microcomputer and more particularly to a microcomputer with a single semiconductor chip on which a program memory, a program execution unit and a program mode setting circuit are provided.

2. Description of the Prior Art

In a microcomputer, generally, a program mode setting circuit is employed and which generates a start address of a program to be executed by a program execution unit (e.g. a central processing unit: CPU). The start address is set to a program counter which in turn designates the program to be read out of a program memory (for example, a read only memory: ROM) storing a plurality of instructions. The program mode setting circuit receives a mode designation signal which is applied through an external terminal of a microcomputer to the program mode setting circuit from the outside of the microcomputer. In response to the mode designation signal, the start address is read out of the program mode setting circuit and is applied to the program counter. According to a content of the program counter, an instruction located at the start address of the desired program is read out of the program memory. If the desired program contains a plurality of instructions, the remaining instructions are sequentially read out of the program memory in response to an increment operation of the program counter and are executed by the execution unit. Thus, the microcomputer automatically executes the desired program in response to the program mode designation signal applied thereto from the outside.

An example of the program mode setting circuit is an initialization circuit which initializes the program execution unit in response to a reset signal applied through a reset terminal to the initialization circuit. When the reset signal is applied, the content of the program counter is set to be, usually, zero and the start program having the zero start address is executed. In a conventional microcomputer, however, only one start address can be set in the program counter.

In the prior art, the microcomputer requires a plurality of program mode designation signals, when a plurality of desired programs are selectively designated, and a plurality of external terminals receiving them must be provided on a microcomputer chip. This makes a chip size larger and a production cost higher.

SUMMARY OF THE INVENTION

An object of the present invention is to provide a microcomputer which requires only one external terminal to designate a plurality of program modes.

Another object of the present invention is to provide a microcomputer in which an arbitrary address among a plurality of start addresses can be set in a program counter at a short period of time.

Still another object of the present invention is to provide a microcomputer which can designate a plurality of program modes by using only one reset terminal or only one interruption terminal.

A microcomputer according to the present invention comprises at least one external terminal through which a pulse signal is applied, a pulse width measuring circuit coupled to the external terminal for measuring a pulse width of the applied pulse signal, an address generating circuit selectively generating one of a plurality of program start addresses according to the measuring result of the pulse width measuring circuit, and means for applying the generated program start address to a program counter.

According to the present invention, since an arbitrary one of the plurality of program start addresses can be selected in accordance with a pulse width of a pulse signal, a plurality of program modes can be designated by using a single external terminal through which the pulse signal is supplied. In other words, the microcomputer requires only one external terminal to which a plurality of pulse signals having deferent pulse widths are applied to designated selected one of a plurality of program modes. Therefore, the present invention can provide a microcomputer in which an arbitrary program mode is selected and present at a higher speed with at least one external terminal.

DETAILED DESCRIPTION OF THE EMBODIMENTS

Figure 1:
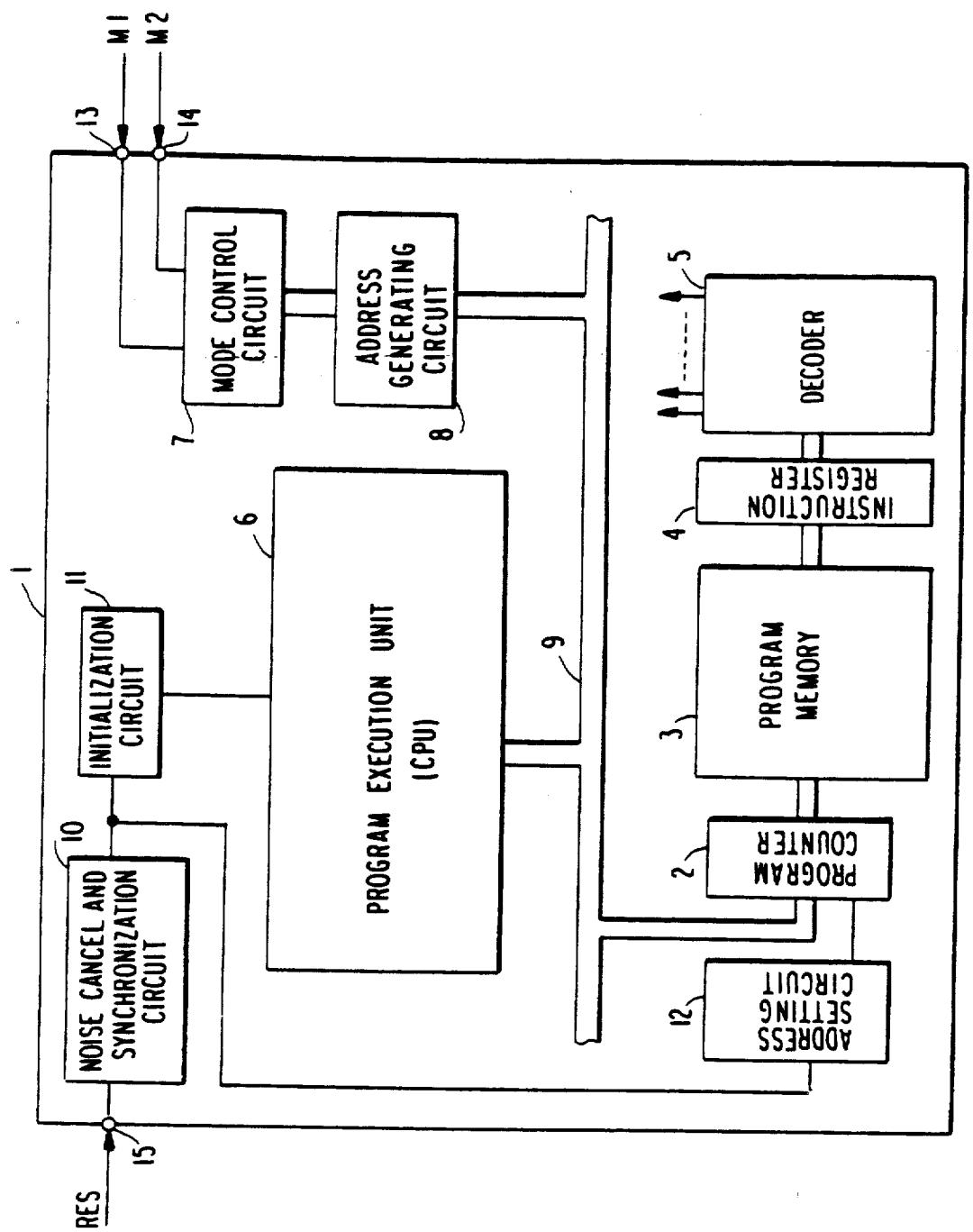
FIG. 1 shows a block diagram of a conventional microcomputer which can set a plurality of program modes.

FIG. 1 illustrates a block diagram of a conventional microcomputer 1 which receives two program mode designation signals $M_1$ and $M_2$ at two external terminals 13 and 14 and to set one of four program modes. The microcomputer 1 has in general a program counter 2, a program memory (ROM)3, an instruction register 4, an instruction decoder 5 and a program execution unit (CPU)6. The program memory (ROM)3 stores a plurality of programs each of which contains at least one instruction. An instruction designated by an address of the program counter 2 is read out of the ROM3 and is fetched into the instruction register 4, and thereafter the fetched instruction is decoded by the decoder. As a result of decoding, a plurality of control signals are generated and are supplied to the program execution unit (CPU)6. The CPU6 executes the instruction according to the control signals. By repeating these operations, a program can be executed. When the CPU6 executes a data transmission instruction, a data is transferred through an internal bus 9 coupled to the CPU6.

Here, in the case of a program mode setting operation, two mode designation signals $M_1$ and $M_2$ are applied through external terminals 13 and 14 to a mode control circuit 7 from the outside of the microcomputer 1. An address generating circuit 8 can generate one of four program start addresses in response to an output of the mode control circuit 7. If $M_1$ and $M_2$ are both "H", the mode control circuit 7 outputs a first signal, and the address generating circuit 8 generates a first address. This first address is set in the program counter 2 through the internal bus 9, thus a leading instruction of a first program is read out of the ROM and is executed by the CPU6. The program counter 2 is incremented to read a subsequent instruction out of the ROM3. The program counter 2 is sequentially incremented till a last instruction of the first program is read out of the ROM3.

While, if the $M_1$ and $M_2$ are "H" and "L", respectively, a second signal is outputted from the mode control circuit 7 and a second address is generated to access a second program. Thus, a first program to a fourth program can be arbitrary designated by a combination of $M_1$ and $M_2$ signals.

However, at least two external terminals 13 and 14 are required to designate four program modes. If five program modes are required, at least three external terminals must be employed.

Further, the microcomputer generally includes an initialization circuit 11 to initialize a general purpose register, a status flag register or the like in the CPU6. The initialization circuit 11 supplies to an initialization signal to the CPU6 in response to an output of a noise cancel/synchronization circuit 10 receiving a reset signal RES through an external reset terminal. The output of the circuit 10 is a reset signal synchronized with an internal timing signal and is applied to an address setting circuit 12. The address setting circuit 12 sets a predetermined address into the program counter 2 in response to the output of the circuit 10. In general, the address setting circuit 12 applies a reset signal to the program counter 2 and make the counter 2 clear.

However, when an arbitrary address is required as a program start address after the CPU6 is initialized, the content of the program counter 2 must be changed in the conventional microcomputer 1. This change operation is to be performed by the mode designation signals $M_1$ and $M_2$. Thus, a long period time and a complex operation are necessary.

Figure 2:
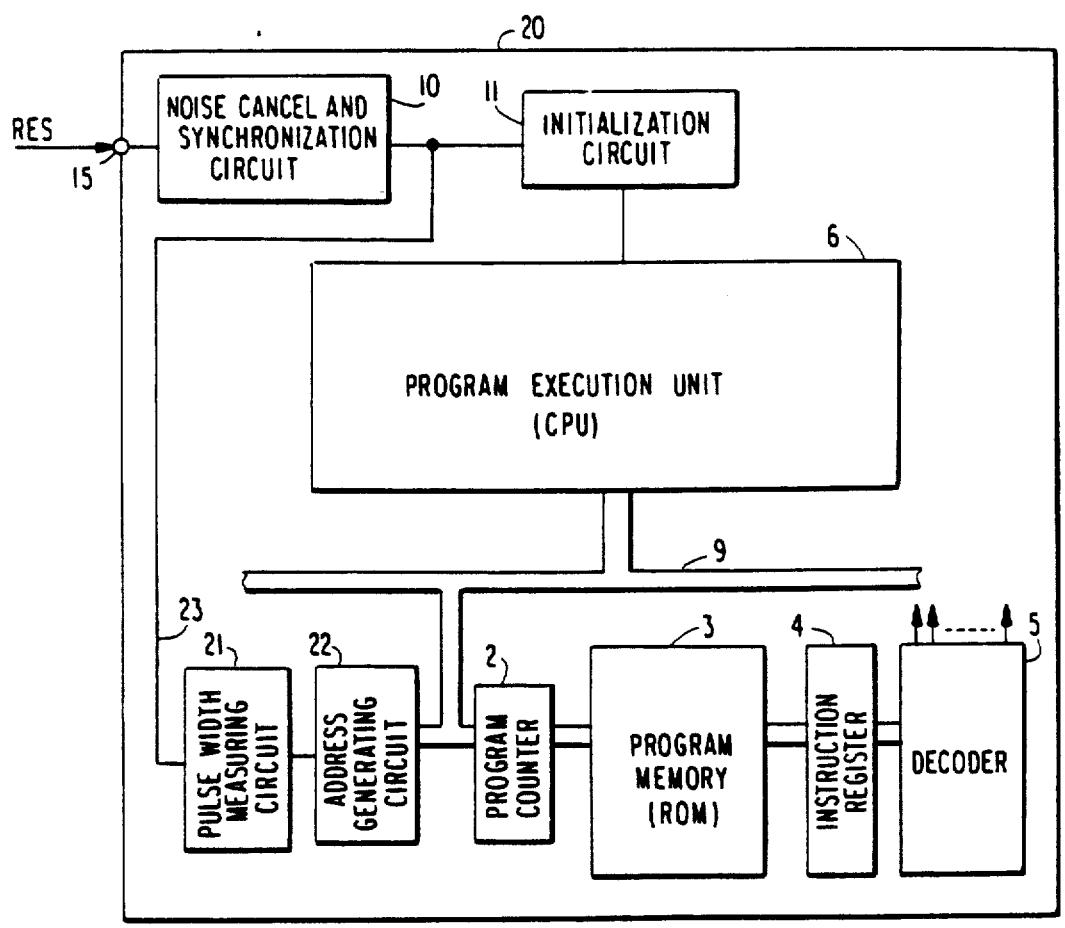
FIG. 2 shows a block diagram of a microcomputer according to an embodiment of the present invention.

FIG. 2 is a block diagram of a microcomputer 20 improved by the present invention. In FIG. 2, the program counter 2, the program memory (ROM)3, the instruction register 4, the decoder 5, the program execution unit (CPU)6, the noise cancel/synchronization circuit 10 coupled to the external reset terminal 15, the initialization circuit 11 and the internal bus 9 may have the same function as that of FIG. 1. Therefore, FIG. 1 and the corresponding description should be referred to these operations.

In FIG. 2, it should be noted that a pulse width measuring circuit 21 is provided and is coupled to the external reset terminal 15. The pulse width measuring circuit 21 is used to measure a pulse width of a reset signal applied through the reset terminal 15 to the initialization circuit 11 and produces a plurality of select signals which are applied to an address generating circuit 22. The address generating circuit 22 can generate a plurality of program start addresses and transfers one of them to the program counter 2 according to a select signal produced by the pulse width measuring circuit 21.

Figure 3:
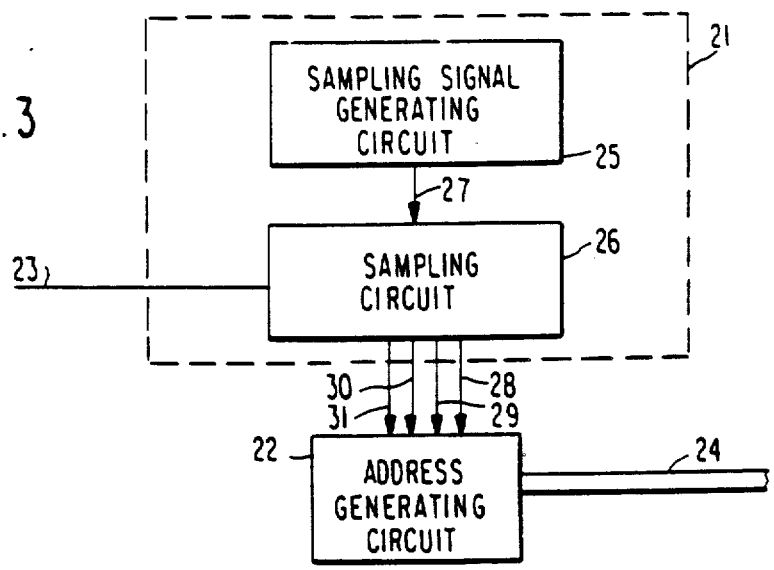
FIG. 3 shows a block diagram of a pulse width measuring circuit and an address generating circuit of FIG. 2.

FIG. 3 shows a block diagram of the pulse width measuring circuit 21 and the address generating circuit 22. The pulse width measuring circuit 21 receives a reset pulse signal through a signal line 23 and has a sampling signal generating circuit 25 and a sampling circuit 26. The sampling signal 27 may use a clock signal with a shorter cycle than that of the reset pulse signal. The sampling circuit 26 samples the reset pulse signal according to the sampling signal 27 and produces a plurality of selecting signals (four selecting signals 28 to 31 in this embodiment) in accordance with a pulse width of the reset pulse signal applied to the reset terminal 15. The address generating circuit 22 can generate four program start addresses in this embodiment, and transfers one of them to the program counter 2 through a bus 24 in response to the selecting signals 28 to 31.

Figure 4:
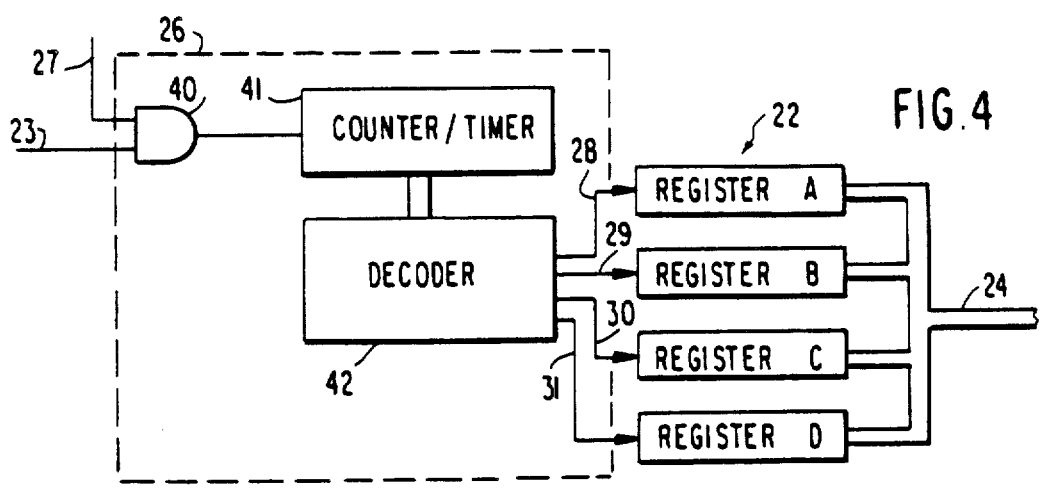
FIG. 4 shows a detailed block diagram of FIG. 3.
Figure 5:
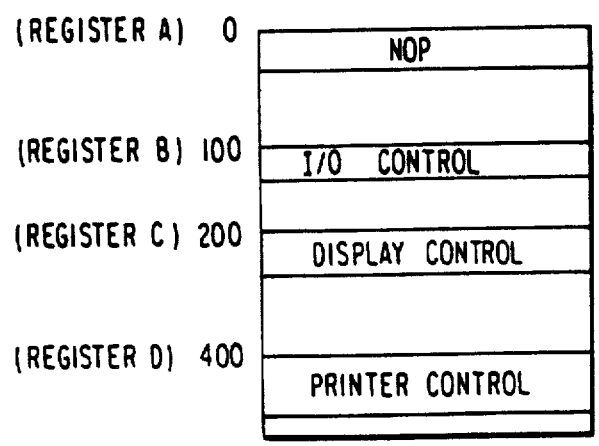
FIG. 5 shows a program memory map used in the microcomputer of FIG. 2.
Figure 6:
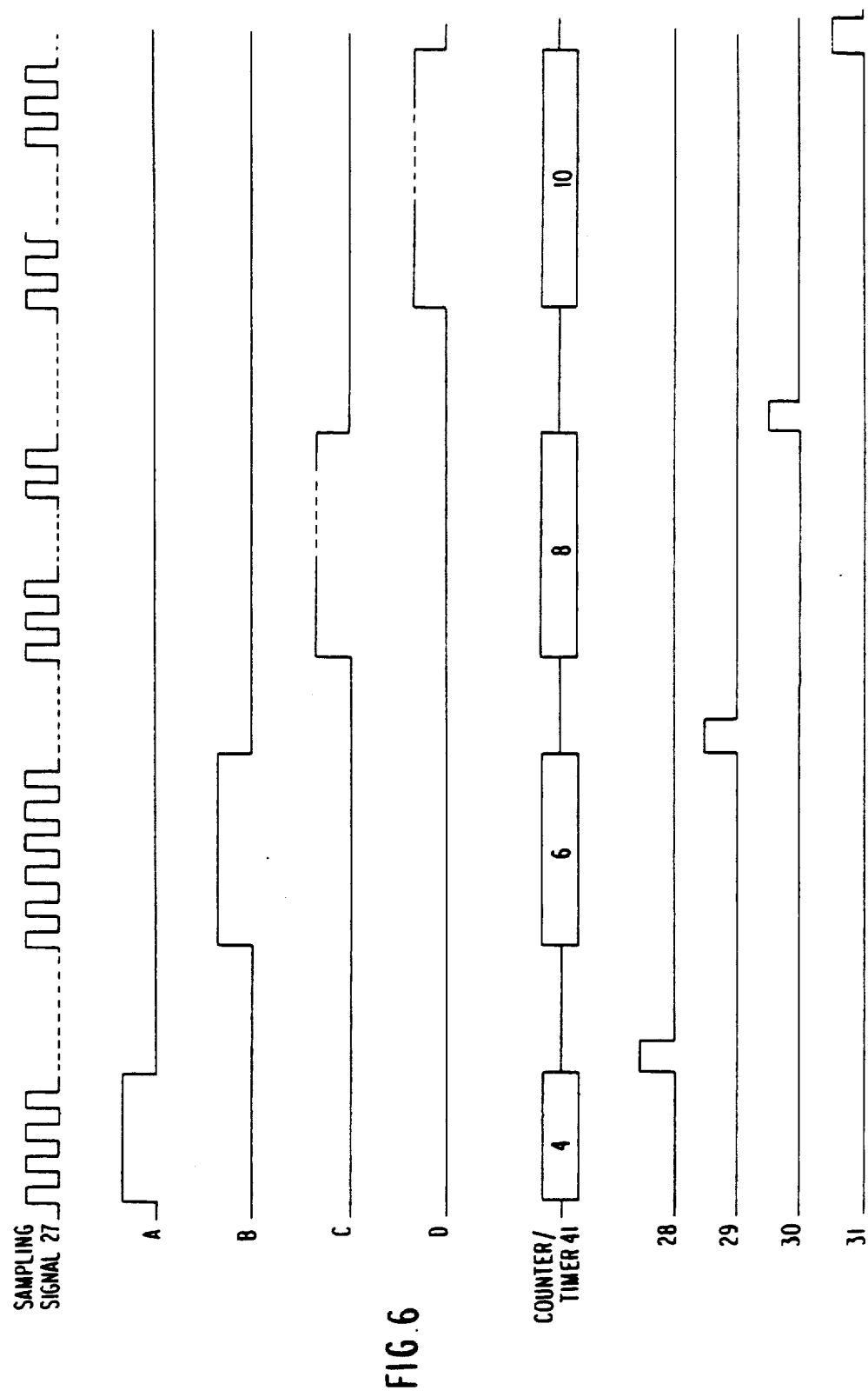
FIG. 6 shows a timing chart of an operation of the microcomputer of FIG. 2.

An example of the sampling circuit and the address generating circuit is shown in FIG. 4, and the program memory map and the timing chart of FIG. 4 is illustrated in FIGS. 5 and 6, respectively. Here, the sampling circuit 26 contains an AND gate 40 whose input ends receive the sampling signal 27 and the reset signal 23, a counter (or a timer) 41, and a decoder 42. The counter 41 is incremented in response to an output of the AND gate 40. If a reset pulse signal A (FIG. 6) includes four clock pulses in the sampling signal 27, a content of the counter 41 becomes "4". Thus, the pulse width of the reset pulse signal A is measured. According to the same operation, a reset pulse signals B, C and D are measured, and contents of the counter 41 become "6", "8" and "10", respectively, as shown in FIG. 6. The decoder 42 decodes the content of the counter 41 and produces one of four selecting signals 28 to 31 according to the content of the counter 41. In FIG. 6, the select signals 28 to 31 are produced when the contents of the counter 41 are "4", "6", "8", and "10", respectively.

The address generating circuit 22 has four registers A to D in which program start addresses "0", "100", "200" and "400" are stored, respectively. That is, the address "0" in the register A designates a leading instruction of a no operation program (NOP) in the ROM3. The address "100", "200" and "400" in the registers B to D designate leading instructions of an input/output control program (I/0), a display control program, and a printer control program, respectively.

As described above, according to the embodiment of FIG. 2, four program modes can be set by using only one reset terminal. In addition, the initialization operation can be performed in parallel. Particularly, since an alteration operation of the program counter 2 is unnecessary after the CPU has been initialized, the mode setting can be performed at a high speed.

Figure 7:
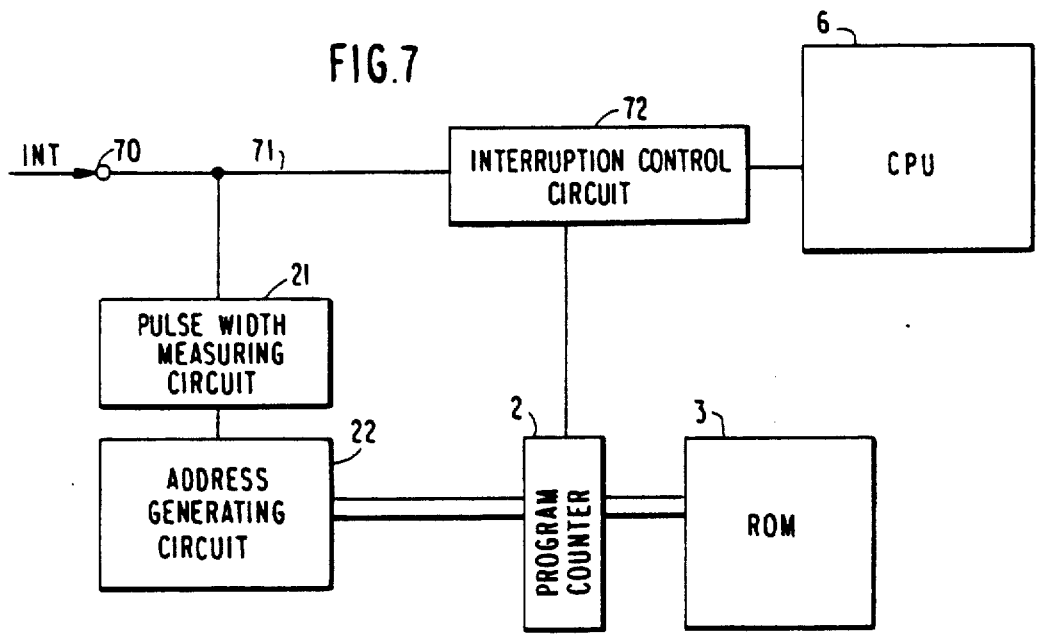
FIG. 7 shows a principle block diagram of a microcomputer according to another embodiment of the present invention.

The present invention can also be applicable to a circuit other than the initialization circuit. FIG. 7 shows a principle block diagram of a microcomputer in which the present invention is applied to an interruption circuit. An interrupt signal (INT) is applied through an interrupt terminal 70 to an interruption control circuit 72 which controls an interruption operation, for example, sheltering operation of a program status word register, a flag in the CPU6 or a program counter 2. In addition, the interrupt signal (INT) is also applied to the pulse width measuring circuit 21 as same function as that of FIG. 2. The address generating circuit 22 generates one of a plurality of jump addresses in accordance with a pulse width of the interrupt signal. Thus, the plurality of jump addresses (or subroutine call addresses) can be set in the program counter 2 by using a single terminal 70.

What is claimed is:

1. A microcomputer comprising a program memory storing a plurality of instructions for a program, a program counter for accessing said program memory to read an instruction from an address location of said program memory designated by address information of said program counter, a central processing unit executing the instruction read from said program memory, a reset terminal supplied with a reset pulse signal made of a variable width of single pulse, an initialization circuit coupled to said reset terminal and said central processing unit and initializing said central processing unit in response to said reset pulse signal, a pulse width measuring circuit having an input node coupled to said reset terminal and a plurality of output nodes provided in correspondence with different pulse widths of said reset signal, said pulse width measuring circuit measuring the pulse width of said reset pulse signal and producing a selection signal at one of said output nodes in response to the measured pulse width of said reset pulse signal, and an address generating circuit storing a plurality of program start addresses and coupled between each of said output nodes of said pulse width measuring circuit and said program counter, said address generating circuit selectively applying one of said program start addresses to said program counter in response to said selection signal produced at said one of said output nodes, whereby said central processing unit is initialized by the received reset pulse signal and thereafter starts to execute the instructions stored in said program memory from an instruction that is stored in an address location of said program memory designated by the program start address which is applied to said program counter in accordance with the pulse width of said received reset pulse signal.

2. The microcomputer as claimed in claim 1, wherein said pulse width measuring circuit includes means for generating a train of clock pulses, means for counting said clock pulses during a time period corresponding to the pulse width of said reset pulse signal and means for decoding a count value of said counting means to produce said selection signal at said one of said output nodes.

3. The microcomputer as claimed in claim 1, wherein said address generating circuit includes a plurality of registers each one of said registers storing each one of said program addresses and connected to one of said output terminals of said pulse width measuring circuit, such that when an output signal is produced on one of said plurality of output terminals, a respective one of said plurality of registers will read-out its program start address and means for transferring the read-out program start address to said program counter.

4. A microcomputer comprising a memory storing a plurality of programs, a program counter coupled to said memory for accessing said memory to read a program therefrom by use of address information of said program counter, a central processing unit executing the program read from said memory, an external terminal for receiving a control pulse signal made of a variable width of a single pulse, means coupled to said external terminal for detecting the pulse width of said control pulse signal to produce a detection signal representative of the pulse width of said control pulse signal, storing means provided independently of said memory for storing a plurality of program start addresses, means coupled to said detecting means and said storing means for outputting one of said program start addresses from said storing means in response to said detection signal, and means for applying said one of said program start addresses read from said storing means to said program counter, whereby said central processing unit stops executing one of said programs by the application of said control pulse signal and thereafter starts to execute another one of said programs in response to the program start address which is applied to said program counter determined in accordance with the pulse width of said control pulse signal.

5. The microcomputer as claimed in claim 4, wherein said external terminal is a reset terminal and said control pulse signal is a reset signal and said central processing unit is initialized by the application of said reset signal and thereafter starts to execute said other one of said programs.

6. The microcomputer as claimed in claim 4, wherein said external terminal is an interrupt terminal and said control pulse signal is an interrupt request signal and said central processing unit suspends temporarily executing said one of said programs and thereafter starts to execute said other one of said programs.

7. A microcomputer comprising:
a program execution unit, a program memory storing a plurality of programs with program start addresses, each of said programs operating said program execution unit, first means for receiving any one of a plurality of external pulse signals which have different pulse widths, each of said pulse widths of said external pulse signals corresponding to a respective one of said program start addresses, second means coupled to said first means for measuring a pulse width of the received external pulse signal, third means for designating one of said program start addresses of said program memory in accordance with the measured pulse width of said received external pulse signal, and fourth means coupled to said first means and said program execution unit for operatively initializing said program execution unit at a predetermined state in response to application of any one of said external pulse signals to said first means, whereby the external pulse signal received by said reset terminal initializes said program execution unit and designates one of the program start addresses corresponding to the pulse width of the received external pulse signal.

8. A microcomputer as claimed in claim 7 wherein said second means comprises:
a sampling signal generator means for generating a plurality of sequential sampling pulses;
gate means having a first input terminal connected to receive said sequential sampling pulses, a second input terminal connected to said reset terminal and an output terminal, said gate means passing said sequential sampling pulses at said output terminal during a time when the external pulse signal is received by said reset terminal; and
counter means for counting the number of sequential sampling pulses passed by said gate means, and producing an output count indicative of the width of said external pulse signal received.

9. A microcomputer as claimed in claim 8, wherein said gate means is a two-input AND gate.

10. A microcomputer as claimed in claim 7, wherein said third means comprises:
decoder means connected to receive the output count from said second means and having a plurality of output terminals each corresponding to each of the pulse widths of said external pulse signals, said decoder means selectively actuating one of said plurality of output terminals; and a plurality of program start address registers, a respective one of said registers each being connected to a respective one of said output terminals of said decoder means, such that when an output signal is produced on one of said plurality of output terminals, a respective one of said registers will output its predetermined start address.

11. A microcomputer comprising:

a program execution unit, a program memory storing a plurality of programs with program start addresses, each of said programs operating said program execution unit, a first means for receiving an external pulse signal of a variable width of a single pulse, a pulse width measuring circuit coupled to said first means for measuring the pulse width of the external pulse signal received by said first means, said pulse width measuring circuit producing an output signal indicative of said measured pulse width of the received external pulse signal, an address generating circuit connected to said pulse width measuring circuit and said program memory for designating one of said program start addresses in accordance with the output signal produced by said pulse width measuring circuit, and an initialization circuit coupled to said first means and said program execution unit for initializing said program execution unit for initializing said program execution unit at a predetermined state in response to the receipt of said external pulse signal to said first means, whereby said program execution unit is initialized in response to the received external pulse signal and one of said program start addresses is designated in accordance with the measured pulse width of said received external pulse signal.

12. A microcomputer as claimed in claim 11, wherein said pulse width measuring circuit comprises:

a sampling signal generator means for generating a plurality of sequential sampling pulses;

gate means having a first input terminal connected to receive said sequential sampling pulses, a second input terminal coupled to said reset terminal means and an output terminal, said gate means operatively passing said sequential sampling pulses at said output terminal wherein the external pulse signal is being received; and counter means for counting the number of sequential sampling pulses passed by said gate means, and producing an output count indicative of the width of said external pulse signal received.

13. A microcomputer as claimed in claim 12, wherein said gate means is a two-input AND gate.

14. A microcomputer as claimed in claim 11, wherein said pulse width measuring circuit includes a counter for operatively performing a counting operation, control means for enabling said counter in response to the received external pulse signal, and decoder means coupled to receive the output signal from said counter and having a plurality of output terminals provided in correspondence with different pulse widths of said external pulse signals, said decoder means selectively activating one of said plurality of output terminals in accordance with the measured pulse width of the received external pulse signal; and said address generating circuit includes:

a plurality of program start address registers, a respective one of said registers being connected to a respective one of said output terminals of said decoder means, such that when an output signal is produced on one of said plurality of output terminals, a respective one of said registers will designate its program start address.

15. A microcomputer comprising:

a program execution unit, a program memory storing a plurality of programs with program start addresses, each of said programs operating said program execution unit, an external terminal for receiving any one of a plurality of single pulse type interrupt signals which have different pulse widths, interrupt control circuit means coupled to said external terminal and said program execution unit, said interrupt control circuit means interrupting an operation performed by said program executing unit each time an interrupt signal is received at said external terminal, pulse width measuring means coupled to said external terminal for measuring a pulse width of the interrupt signal received by said external terminal, and address generating means coupled to said pulse width measuring means and said program memory for designating one of said program start addresses of said program memory in correspondence with the pulse width of the received interrupt signal measured by said pulse width measuring means, whereby the operation of said program execution unit is interrupted in response to the received interrupt signal and one of the program start addresses of said program memory is designated in accordance with the pulse width of said received interrupt signal.

* * * * *

UNITED STATES PATENT AND TRADEMARK OFFICE
CERTIFICATE OF CORRECTION

PATENT NO. : 4,992,937

DATED : February 12, 1991

INVENTOR(S) : Toru Hemmi

It is certified that error appears in the above-identified patent and that said Letters Patent is hereby corrected as shown below:

Col. 7, lines 29 and 30, delete "for initializing said program execution unit".

Signed and Sealed this

Fifteenth Day of September, 1992

Attest:

DOUGLAS B. COMER

*Attesting Officer*     *Acting Commissioner of Patents and Trademarks*